United States Patent [19]

Shimizu et al.

[11] Patent Number: 5,360,744
[45] Date of Patent: Nov. 1, 1994

[54] METHOD OF MANUFACTURING IMAGE SENSOR

[75] Inventors: Yasumoto Shimizu; Hisao Ito, both of Kanagawa, Japan

[73] Assignee: Fuji Xerox Co., Ltd., Tokyo, Japan

[21] Appl. No.: 221,541

[22] Filed: Apr. 1, 1994

Related U.S. Application Data

[63] Continuation of Ser. No. 904,896, Jun. 25, 1992, abandoned, which is a continuation of Ser. No. 638,982, Jan. 19, 1991, abandoned.

[30] Foreign Application Priority Data

Jan. 11, 1990 [JP] Japan ................................ 2-2589

[51] Int. Cl.$^5$ ............................................. H01L 21/324
[52] U.S. Cl. ........................................... 437/2; 437/3
[58] Field of Search ............................... 437/2, 3, 4, 5

[56] References Cited

U.S. PATENT DOCUMENTS

| | | | |
|---|---|---|---|
| 4,517,733 | 5/1985 | Hamano | 437/2 |
| 4,874,957 | 10/1989 | Sasaki et al. | 357/30 L |
| 4,939,592 | 7/1990 | Saika et al. | 250/208.1 |
| 4,953,000 | 8/1990 | Kaifu et al. | 350/30 K |
| 4,982,079 | 1/1991 | Yagyu et al. | 250/208.1 |
| 4,988,631 | 1/1991 | Ogawa et al. | 437/2 |
| 4,997,773 | 3/1991 | Nobue et al. | 437/2 |
| 5,027,176 | 6/1991 | Saika et al. | 357/30 H |
| 5,060,040 | 10/1991 | Saika et al. | 357/30 K |
| 5,061,979 | 10/1991 | Kobayashi et al. | 357/30 G |
| 5,075,244 | 12/1991 | Sakai et al. | 357/30 K |
| 5,086,218 | 2/1992 | Yagyu | 250/208.1 |

FOREIGN PATENT DOCUMENTS

| | | | |
|---|---|---|---|
| 0297413 | 1/1989 | European Pat. Off. | 437/2 |
| 63-9358 | 1/1988 | Japan . | |
| 63-67772 | 3/1988 | Japan . | |
| 63-67864 | 3/1988 | Japan . | |
| 63-5057 | 1/1989 | Japan . | |
| 0246771 | 2/1990 | Japan | 437/2 |

*Primary Examiner*—Brian E. Hearn
*Assistant Examiner*—Michael Trinh
*Attorney, Agent, or Firm*—Finnegan, Henderson, Farabow, Garrett & Dunner

[57] ABSTRACT

A method of manufacturing an image sensor comprising light-receiving elements, thin film transistor switching elements, and a group of lines, in which the metal electrode portion of each light-receiving element, the source and drain electrode portions of each thin film transistor switching element, and the intermediate ground wiring layer of the group of wiring lines can be formed simultaneously. As a result, the image sensor can be prepared with ease under an efficient process.

5 Claims, 7 Drawing Sheets

METHOD OF MANUFACTURING IMAGE SENSOR

This application is a continuation of application Ser. No. 07/904,896 filed Jun. 25, 1992, now abandoned, which is a continuation of application Ser. No. 07/638,982 filed Jan. 10, 1991, now abandoned.

BACKGROUND OF THE INVENTION

The present invention relates to a method of manufacturing an image sensor for use in facsimile machines or scanners, and particularly to a method of manufacturing, under a simple process, an image sensor, having a group of matrix-formed wiring lines, capable of outputting read signals correctly.

In a conventional image sensors, particularly a contact type image sensor, image information of a document, for example, is projected onto the sensor in one-to-one correspondence, and then the sensor converts the image information into electrical signals. In this case, the projected image is divided into a multiplicity of pixels (light-receiving elements) and the electric charge generated at the respective light-receiving elements is temporarily stored at interline capacitors of a group of wiring for every predetermined block using a thin film transistor switching element (TFT). Then, the stored electric charge is sequentially read as electric signals at speeds ranging from several hundreds of KHz to several MHz. Such a TFT-driven image sensor can read image information with a single drive IC owing to TFT operation, thereby contributing to reducing the number of drive ICs, which serve to drive the image sensor.

Figure 7:
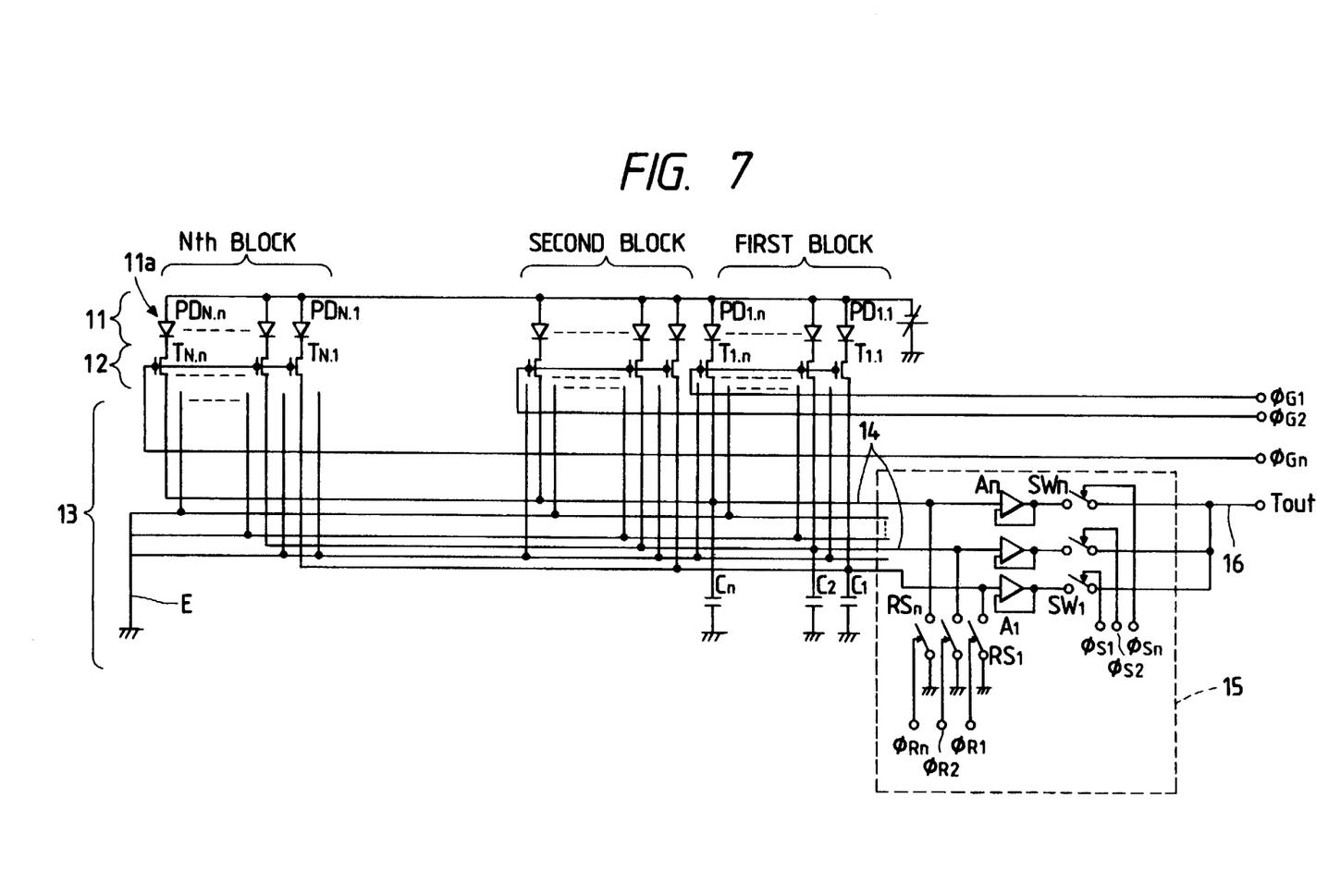
FIG. 7 is an equivalent circuit diagram of an image sensor.

The TFT image sensor, e.g., as shown in FIG. 7, includes a line shaped light-receiving element array 11 whose length is almost the same as the length of a document; an electric charge transfer section 12 consisting of a plurality of thin film transistors Ti,j (i=1 to N, j=1 to n) corresponding to the respective light-receiving elements on a one-to-one basis; and a group of wiring lines 13.

The light-receiving element array 11 consists of a plurality (N) of blocks of light-receiving elements, a plurality (n) of light-receiving elements 11a, which constitute each block, can be represented equivalently as a plurality of photodiodes PDi,j (i=1 to N, j=1 to n). Each light-receiving element 11a is connected to the drain electrode of each thin film transistor Ti,j. The source electrode of each thin film transistor Ti,j is connected to each of a plurality (n) of common signal lines 14 for every block of light receiving elements through the matrix-formed wiring group 13. The gate electrode of each thin film transistor Ti,j is connected to a gate pulse generating circuit (not shown) so that the thin film transistors Ti,j are turned on for every block. The photoelectric charge generated at each light-receiving element 11a is temporarily stored at both a parasitic capacitor of each light-receiving element and an overlap capacitor arranged between the drain and gate of the thin film transistor and thereafter, sequentially transferred to and stored in the interline capacitors Cj of the wiring group 13 for every block using each thin film transistor Ti,j as an electric charge transfer switch. Specifically, a gate pulse ΦG1 from the gate pulse generating circuit turns on the thin film transistors T1,1 to T1,n, thereby transferring to and storing the electric charge generated and stored at each light-receiving element 11a in the first block to each interline capacitor Cj. The electric charge stored at each interline capacitor Cj changes the potential of each common signal line 14, and each changed potential is taken out at an output line 16 by sequentially turning on analog switches SWn within a drive IC 15. The thin film transistors T2,1–T2,n to TN,1–TN,n of the second to Nth blocks are similarly turned on by gate pulses ΦG2 to ΦGn, transferring the electric charge on the side of the light-receiving elements for every block. By sequentially reading the transferred electric charge, pixel signals equivalent to a single line in a main scanning direction of the document can be obtained. The above operation is repeated by shifting the document by document forwarding means (not shown) such as rollers, thereby obtaining the pixel signals of the entire document. Japanese Patent Unexamined Publications Nos. 9358/1988 and 67772/1988 provide a description relating to this type of operation.

Figure 8:
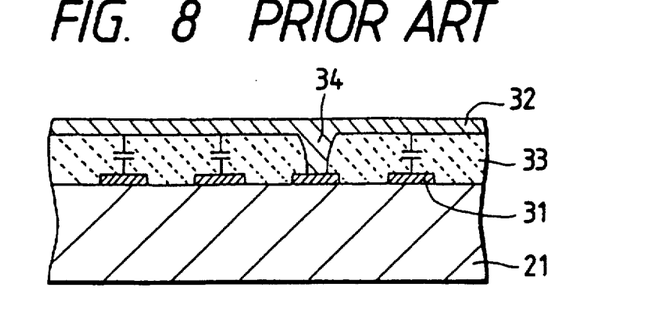
FIG. 8 is a sectional view illustrative of a conventional wiring group.

The matrix-formed wiring group 13 is generally arranged as follows. It includes, as shown in FIG. 8 by its sectional view, lower wiring 31, an insulating layer 33, upper wiring 32, all of these being sequentially formed on a substrate 21. Both the lower wiring 31 and the upper wiring 32 are arranged so as to intersect orthogonally, and contact holes 34 are provided to connect both upper and lower wiring lines.

Figure 9:
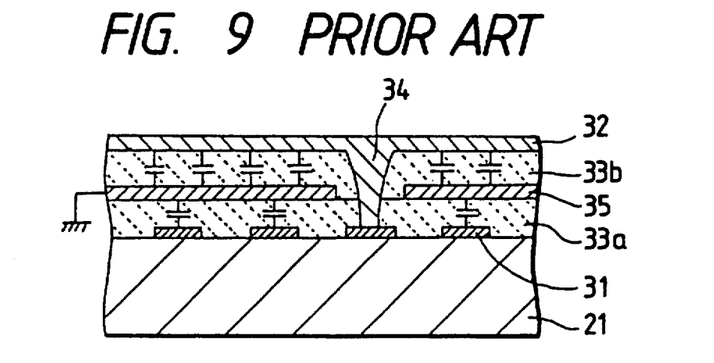
FIG. 9 is a sectional view illustrative of the conventional wiring group having a ground sheet.

To overcome the problem of crosstalk generated at each intersecting portion of the lines in the matrix-formed wiring group 13, an insulating layer 33a, a ground sheet 35 which is connected to a ground line, and an insulating layer 33b are arranged to prevent the crosstalk at the ground sheet 35 as shown in FIG. 9. Japanese Patent Unexamined Publication No. 67864/1987 provides a description relating to this type of arrangement. The crosstalk is a phenomenon that since a capacitor exist at a portion where signal lines intersect in a multilayer form, a change in the potential of one signal line is transferred to another signal line through the capacitor and causes a change in the potential of another.

Figure 10:
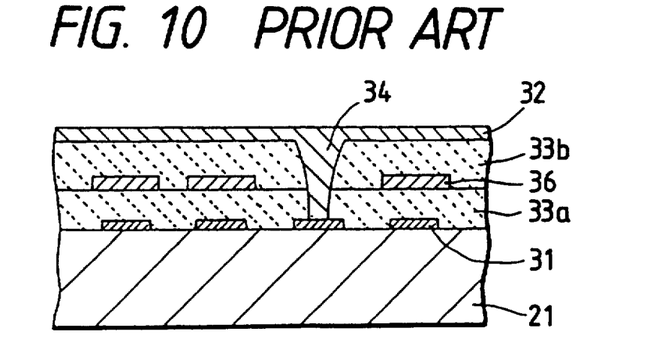
FIG. 10 is a sectional view illustrative of the conventional wiring group having a meshed ground layer.

However, the wiring line group having the ground sheet not only induces large parasitic capacitors between the wiring lines and the ground sheet but also bends the entire image sensor due to warpage of the ground sheet. Thus the ground sheet has been modified as shown in FIG. 10 by its sectional view. Specifically, an intermediate ground wiring layer 36 using a meshed ground member is provided around each portion where the upper and lower wiring lines intersect. Japanese Patent Unexamined Publication No. 5057/1989 provides a description relating to this type of arrangement.

However, the method of manufacturing an image sensor in which the light-receiving elements, the thin film transistor switching elements, and the wiring line group including the meshed intermediate ground wiring layer are formed simultaneously and efficiently on a single substrate has not been proposed. Thus the conventional fabricating process has been complicated.

SUMMARY OF THE INVENTION

The present invention has been made in view of the above circumstances. Accordingly, an object of the invention is to provide a method of manufacturing, under a simple process, an image sensor having a matrix-formed wiring line group capable of outputting read signals correctly.

To achieve the above object, the present invention provides a method of manufacturing an image sensor which comprises a light-receiving element having a metal electrode, a photoconductive layer, and a transparent electrode sequentially laminated; a thin film transistor switching element having a gate electrode, a source electrode, and a drain electrode; and a group of upper and lower wiring layers interposing an intermediate ground wiring layer therebetween with the upper and lower wiring arranged in a matrix form to constitute a wiring group; with the light-receiving element, the thin film transistor switching element, and the wiring group being formed on a single substrate. The method of manufacturing such an image sensor comprises the steps of simultaneously depositing a metal electrode portion of the light-receiving element, a source electrode portion and a drain electrode portion of the thin film transistor switching element, and an intermediate ground wiring layer of the wiring line group using an identical metal, and patterning the deposited portions thereafter.

According to the method of manufacturing an image sensor of the present invention, the metal electrode of the light receiving elements, the source and drain electrode portions of the thin film transistor switching element and the intermediate ground wiring layer of the wiring group are deposited simultaneously with a metal such as Cr, thereby allowing the image sensor to be produced simply under an efficient fabrication process.

DETAILED DESCRIPTION OF THE PREFERRED EMBODIMENT

An embodiment of the present invention will be described with reference to the accompanying drawings. An equivalent circuit diagram of the image sensor of the present invention is the same as that of the conventional image sensor shown in FIG. 7.

The image sensor of the invention includes: a light-receiving element array 11 (PD1,1 to PDN,n) having a plurality (N) of blocks of light-receiving elements, each block consisting of a plurality (n) of sandwich type light-receiving elements (photodiode PD) 11a juxtaposed on an insulating substrate 2 made of, e.g., glass; an electric charge transfer section 12 consisting of thin film transistors T1,1 to TN,n, each being connected to each light-receiving element 11a; a group of matrix-formed wiring 13 including an intermediate ground wiring layer 36; a plurality (n) of common signal lines 14, each corresponding to each block of light-receiving elements extending from the electric charge transfer section 12 through the wiring group 13; and analog switches SW1 to SWn disposed within a drive IC 15 to which each common signal line 14 is connected.

Figure 1:
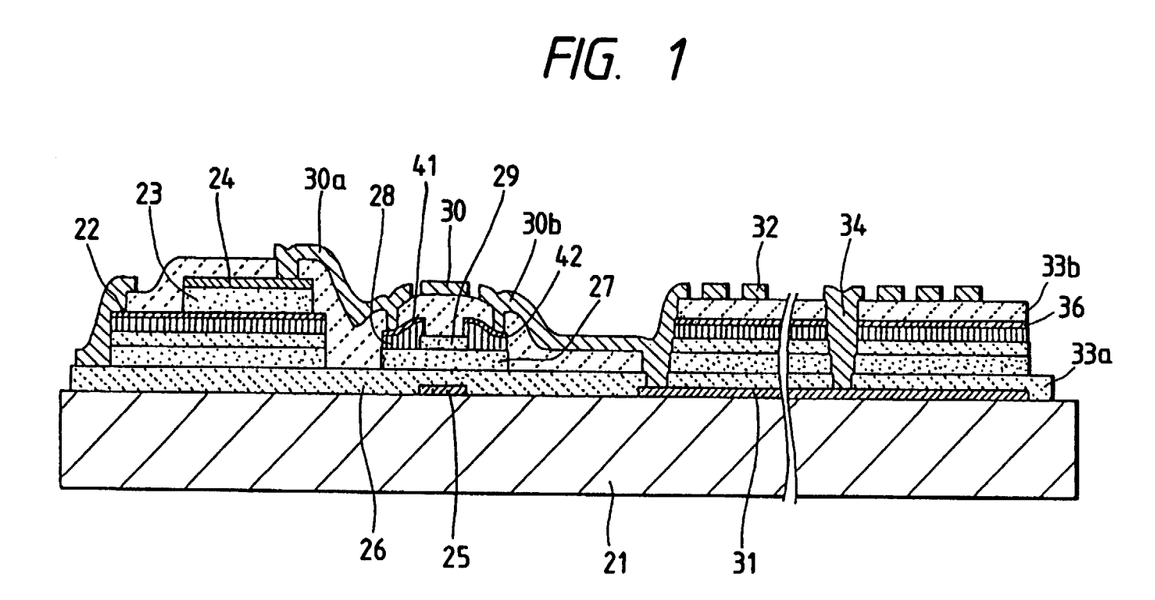
FIG. 1 is a sectional view showing the appearance of an image sensor, which is an embodiment of the present invention.
Figure 2A:
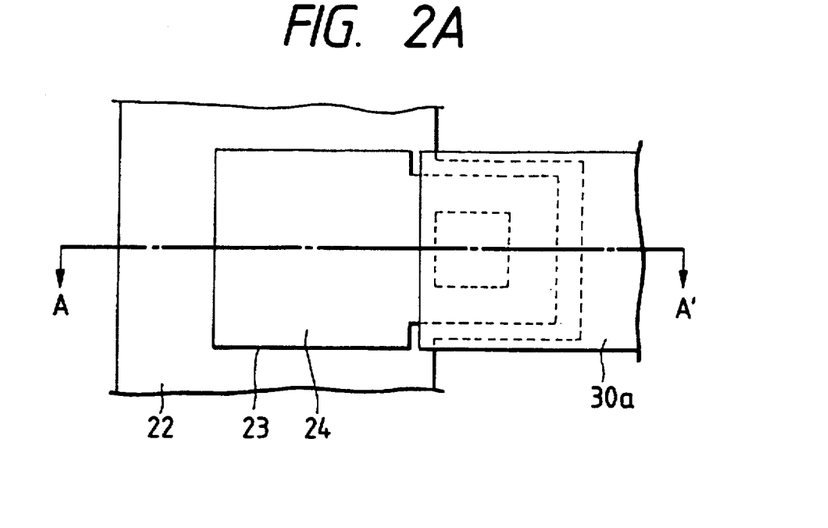
FIGS. 2A and 2B are a plan view and a sectional view illustrative of a light-receiving element portion or the image sensor shown in FIG. 1, respectively.
Figure 2B:
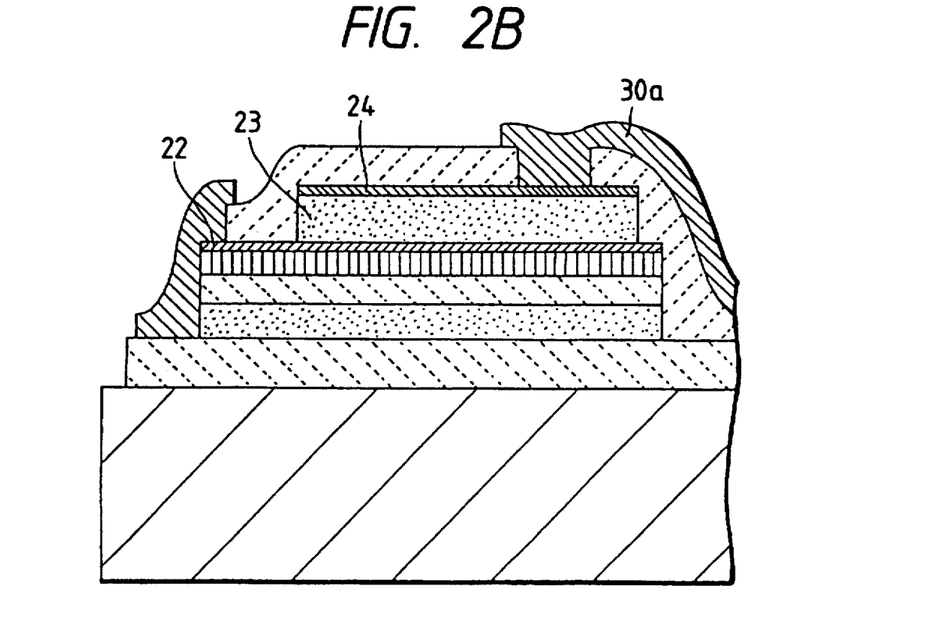

FIG. 2A is a plan view illustrative of the light-receiving element 11a of the embodiment and FIG. 2B is a sectional view illustrative of a portion taken along line A—A' in FIG. 2A.

As shown in FIG. 2B, each light-receiving element 11a has a sandwiched structure such that a lower belt-like metal electrode 22 made of, e.g., Cr forming a common electrode, a photoconductive layer 23 made of amorphous silicon hydride (a-Si:H) which is segmented into each light-receiving element 11a, and a similarly segmented upper transparent electrode 24 made of indium-tin oxide (ITO) are sequentially laminated on a substrate 21 made of, e.g., glass. The lower metal electrode 22 is formed so as to be belt-like in a main scanning direction and the photoconductive layer 23 is sparsely segmented on the metal electrode 22, while the upper transparent electrode 24 is similarly sparsely segmented so as to form individual electrodes. As a result, a portion interposing the photoconductive layer 23 between the metal electrode 22 and the transparent electrode 24 constitutes each light-receiving element 11a, the blocks of which constitute the light receiving array 11. A line 30a made of, e.g., Al is connected to an end of each sparsely segmented transparent electrode 24, while the other end of the line 30a is connected to the drain electrode 41 of each thin film transistor Ti,j of the electric charge transfer section 12. In the light-receiving element 11a a material such as CdSe (cadmium selenade) may be used as a photoconductive layer in place of a-Si:H. The photoconductive layer 23 and the transparent electrode 24 are individualized to reduce interference to be induced by a common layer between the adjacent electrodes if the former made of a-Si:H serves as the common layer.

Moreover, the photoconductive layer 23 of the light-receiving element 11a may be made of a-Si:H. p-i-n, a-SiC, or a-SiGe. The light-receiving element 11a may be a photoconductor or phototransistor instead of a photodiode.

Figure 3A:
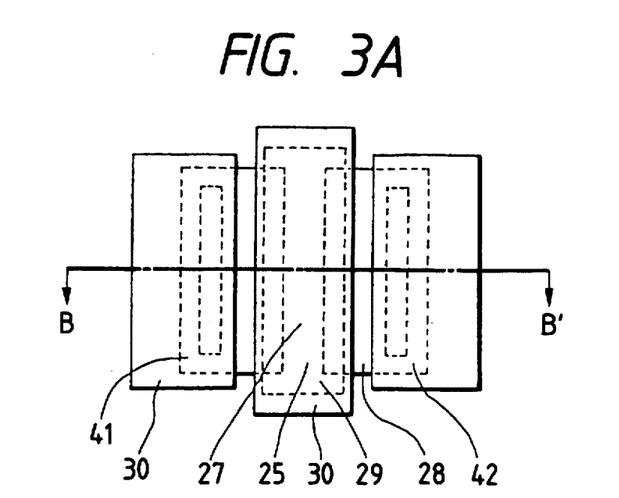
FIGS. 3A and 3B are a plan view and a sectional view illustrative of an electric charge transfer portion of the image sensor shown in FIG. 1, respectively.
Figure 3B:
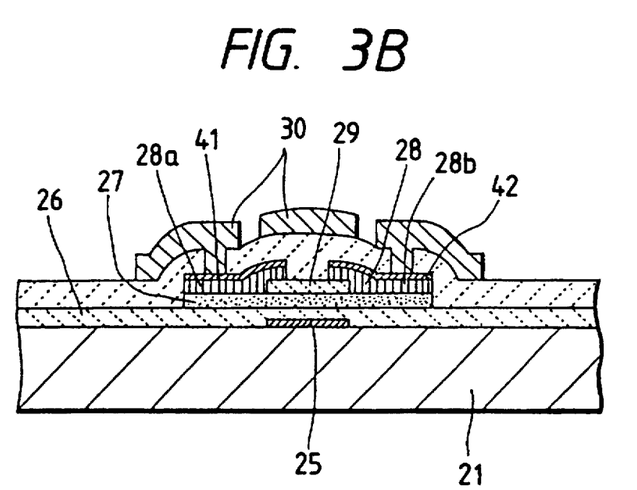

FIG. 3A is a plan view illustrative of the thin film transistor of the electric charge transfer section 12 of the embodiment, while FIG. 3B is a sectional view illustrative of a portion taken along line B—B' in FIG. 3A.

Each thin film transistor TN,n constituting the electric charge transfer section 12 is a transistor of reverse-staggered type. A Cr layer serving as a gate electrode 25, an SiNx film serving as a gate insulating layer 26, an a-Si:H layer serving as a semiconductor activated layer 27, an SiNx film serving as a top insulating layer 29, an n+ a-Si:H layer serving as an ohmic contact layer 28, a Cr layer serving as a drain electrode 41 portion and a source electrode 42 portion, and an Al layer 30 serving as a line layer are laminated in the order written. A wiring line 30a extending from the transparent electrode 24 of the light-receiving element is connected to the drain electrode 41. The ohmic contact layer 28 is separated into a partial layer 28a that is in contact with the drain electrode 41 and a partial layer 28b that is in contact with the source electrode 42. The Cr Layer constituting the drain electrode 41 portion and the source electrode 42 portion extends so as to cover the ohmic contact layers 28a and 28b.

A similar advantage may be provided by forming the semiconductor activated layer 27 using polysilicon or the like.

Figure 4A:
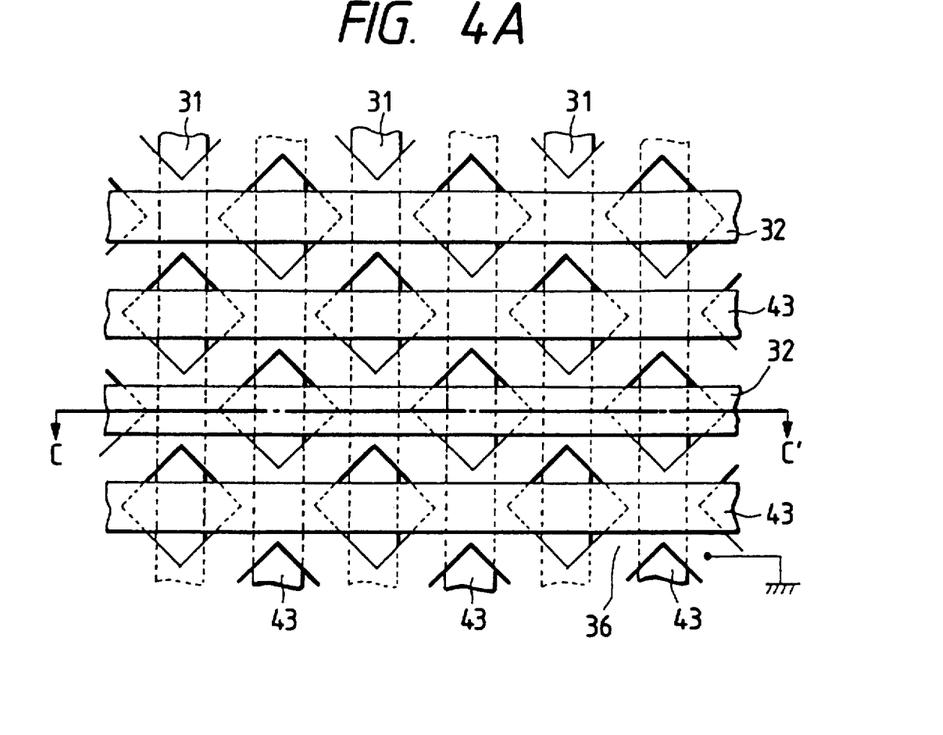
FIGS. 4A and 4B are a plan view and a sectional view illustrative of a wiring group of the image sensor shown in FIG. 1.
Figure 4B:
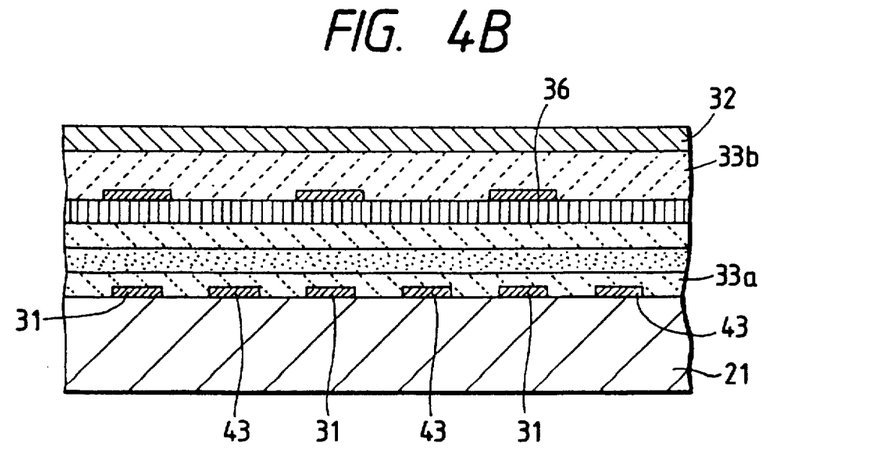

FIG. 4A is a plan view illustrative of the line group 13 of the embodiment, while FIG. 4B is a sectional view illustrative of a portion taken along line C—C' in FIG. 4A.

The wiring group 13 is of a multilayer interconnection structure. Each lower wiring 31 (vertical line) is made of a Cr layer and each upper wiring 32 (horizontal line) is made of an Al layer. The upper wiring 31 and the lower wiring 32 are arranged in matrix form interposing therebetween the first insulating layer 33a made of SiNx, the a-Si:H layer used as the semiconductor activated layer 27 in the thin film transistor, the insulating layer made of SiNx used as the top insulating layer 29 in the thin film transistor, the n+ a-Si:H layer as the ohmic contact layer 28, the intermediate ground wiring layer 36 made of a Cr layer, and the second insulating layer 33b made of polyimide. The intermediate ground wiring layer 36 made of a Cr layer is provided to reduce crosstalk at the intersecting portions of the respective lines. The upper and lower lines are connected through contact holes 34. A ground line 43 is provided between every signal lines arranged in parallel, so that the crosstalk between adjacent wiring lines can be prevented.

Figure 5:
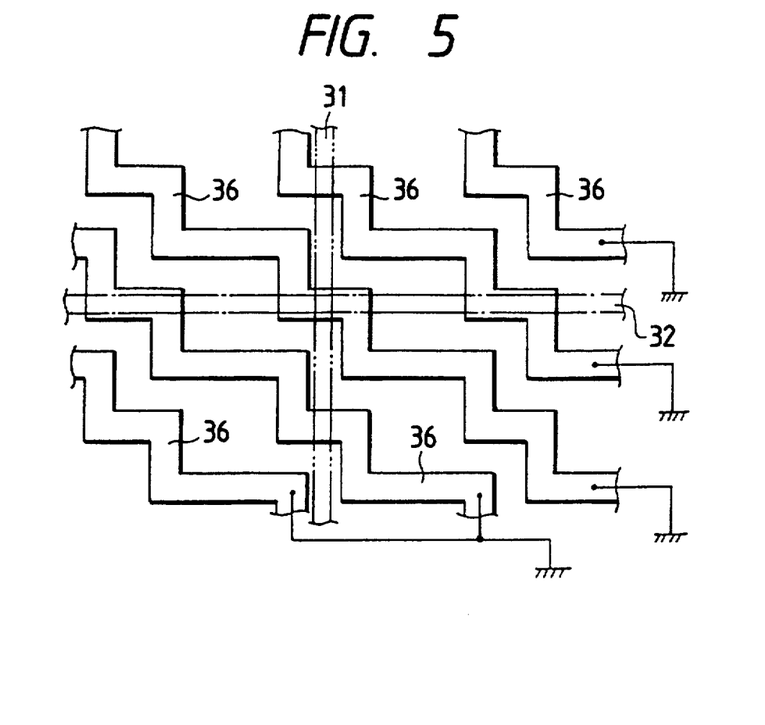
FIG. 5 is a plan view illustrative of a zigzag pattern of a ground layer.
Figure 6:
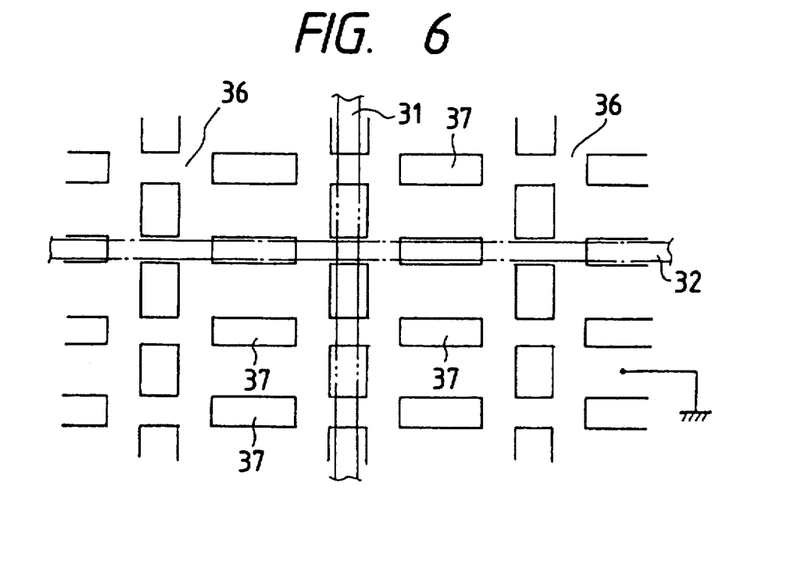
FIG. 6 is a plan view illustrative of a punched pattern of the ground layer.

As shown in FIGS. 4A and 4B, the intermediate ground wiring layer 36 formed between the upper and lower signal lines is formed into a meshed pattern so as to overlap intersecting portions of the meshed intermediate ground wiring layer 36 on and around the intersecting portions of the upper and lower wiring lines arranged in the multilayer form. The intermediate ground wiring layer 36 may either be zigzagged as shown in FIG. 5 or be punched with punch holes 37 as shown in FIG. 6 to obtain an advantage similar to that of the net-like patterned ground layer. It should be noted, however, that the upper and lower lines are represented by only one line each in FIGS. 5 and 6 for simplification.

A protect film is formed on the wiring line group 13 thus formed.

A plurality (n) of the common signal lines 14 are formed of part of the upper lines 32 (horizontal lines) of the wiring group 13 and are connected to the analog switches SW1 to SWn within the drive IC 15. The potential of each common signal line is changed by electric charge stored at each of the interline capacitors C2 to Cn at the wiring group 13 and this potential is taken out at the output line 16 (FIG. 7) by the operation of the analog switch SWn.

A method of manufacturing an image sensor, which is the embodiment of the present invention, will now be described.

First Cr layer 1 is deposited on substrate, made of glass, which has been inspected and cleaned about 750 Å in thickness by a DC sputtering method. The first Cr layer is formed into the gate electrode 25 and the lower lines 31 of the wiring group 13. Then, the Cr layer 1 is subjected to a photolithographic process and an etching process using a solution in which cerium ammonium nitrate, perchloric acid, and water are mixed to form patterns of the gate electrode 25 and the lower wiring 31 of the wiring group 13, and then the photo-resist is removed therefrom. To form the gate insulating layer 26 of the TFT, the semiconductor activated layer 27, and the top insulating layer 29 on the patterned Cr layer 1, an SiNx film., an a-Si:H film, and an SiNx film are sequentially deposited to thicknesses of about 3000 Å, about 500 Å, and about 1500 Å, respectively, by a plasma chemical vapor deposition (P-CVD) method while maintaining the vacuum condition. The continuous deposition process under the vacuum prevents interfacial contamination so as to improve the S/N ratio. The insulating film of the gate insulating layer 26 also serves as the first insulating layer 33a of the line group 13.

The P-CVD conditions for forming the insulating film (b-SiNx) of the gate insulating layer 26 are: a substrate temperature of 300° to 400° C.; an $SiH_4$ and $NH_3$ pressure of 0.1 to 0.5 Torr; an $SiH_4$ flow rate of 10 to 50 sccm; an $NH_3$ flow rate of 100 to 300 sccm; and a radio frequency (RF) power of 50 to 200 W.

The P-CVD conditions for manufacturing the a-Si:H film are: a substrate temperature of 200° to 300° C.; an $SiH_4$ pressure of 0.1 to 0.5 Torr; an $SiH_4$ flow rate of 100 to 300 sccm; and a RF power of 50 to 200 W.

The P-CVD conditions for manufacturing the insulating film (t-SiNx) of the top insulating layer 29 are: a substrate temperature of 200° to 300° C.; an $SiH_4$ and $NH_3$ pressure of 0.1 to 0.5 Torr; an $SiH_4$ flow rate of 10 to 50 sccm; an $NH_3$ flow rate of 100 to 300 sccm; and a RF power of 50 to 200 W.

To pattern the top insulating layer 29 in a form corresponding to the gate electrode 25 and to pattern the insulating layer portion below the metal electrode 22 of the light-receiving element 11a, and the first insulating layer 33a of the wiring group 13, a photolithgraphic method is employed to the Cr layer 1. The patterned Cr layer 1 is coated with the photo-resist thereon, then exposed using a photolithographic mask and developed. Thereafter,it subjected to an etching process to remove the resist. Accordingly, the patterns for the top insulating layer 29, the insulating layer portion below the metal electrode 22 of the light-receiving element 11a, and the first insulating layer 33a of the line group 13 are formed.

The Cr layer 1 thus processed is then subjected to a BHF process, and an n+ a-Si:H film is then deposited thereon about 1000 Å in a thickness as the ohmic contact layer 28 by the P-CVD method using a mixed gas containing SiH and PHi. Then, a second Cr layer 2 is deposited about 1500 Å by a DC magnetron sputtering method. The second Cr layer 2 will constitute the drain electrode 41 and the source electrode 42 of the TFT, the intermediate ground wiring layer 36 of the metal electrode 22 below the light-receiving element 11a, and the wiring group 13 portion. Then, an a-Si:H film which will constitute the photoconductive layer 23 is deposited about 1300 Å by the P-CVD, while an ITO film which will constitute the transparent electrode 24 of the light-receiving element 11a is deposited about 700 Å by the DC magnetron sputtering method. An alkali cleaning process must precede each deposition.

The P-CVD conditions for manufacturing the a-Si:H film are: a substrate temperature of 170° to 250° C.; an $SiH_4$ pressure of 0.3 to 0.7 Torr; an $SiH_4$ flow rate of 150 to 300 sccm; and a RF power of 100 to 200 W.

The DC sputtering conditions for manufacturing the ITO film are: a substrate temperature being at room temperature; an Ar and $O_2$ pressure of $5 \times 10^{-3}$ Torr; an Ar flow rate of 100 to 150 sccm, an $O_2$ flow rate of 1 to 2 sccm; and a DC power of 200 to 400 W.

To form individual electrodes of the transparent electrode 24 of the light-receiving element 11a, the ITO layer is subjected to a photolithographic process and then to an etching process for patterning using a solution in which ferric chloride and hydrochloric acid are mixed. The a-Si:H layer of the photoconductive layer 23 is then dry-etched using a mixed gas of $CF_4$ and $O_2$ without removing the resist, thus using that resist pattern as a mask. The second Cr layer 2 of the metal electrode 22 serves as a stopper at the time the a-Si:H layer is dry-etched and thus it remains unpatterned. During the dry-etching process, the a-Si:H layer of the photoconductive layer 23 has so sharp a side edge that the ITO layer is etched again before removing the resist. As a result, the etching process is continued from around the back of the ITO layer, forming the ITO layer that has the same size as the a-Si:H layer of the photoconductive layer 23.

Then, the Cr layer 2 which will constitute the Cr layer of the metal electrode 22 of the light-receiving element 11a, the Cr layer for the drain electrode 41 and the source electrode 42 of the TFT, and the Cr layer of the intermediate ground wiring layer 36 of the line group 13 is subjected to a photolithographic process and to an etching process for patterning using a solution in which cerium ammonium nitrate, perchloric acid, and water are mixed and for removing the resist to form the metal electrode 22, the drain electrode 41 and the source electrode 42, and the intermediate ground wiring layer 36. When the light-receiving element 11a portion and the TFT portion are dry-etched using a mixed gas of $HF_4$ and $O_2$, the portion at which the Cr layer 2 and the SiNx layer are absent is etched, namely, the a-Si:H layer and the n+ a-Si:H layer are formed. Accordingly, the n+-type a-Si:H layer which will constitute the lower Cr layer of the metal electrode 22 of the light-receiving element 11a and the a-Si:H layer, the n+-type a-Si:H layer of the ohmic contact layer 28 of the TFT, and the a-Si:H layer of the semiconductor activated layer 27 are etched. However, with respect to the wiring group 13 portion, its a-Si:H layer and n+ a-Si:H layer are patterned to form the contact holes 34 using a different photolithographic mask.

Then, to pattern the gate insulating layer 26 of the TFT and to form a contact hole for the insulating layer 33a of the line group 13, the b-SiNx layer is subjected to a photolithographic etching process using a mixed gas of $HF_4$ and $O_2$. And a polyimide film which will constitute the second insulating layer 33b is applied about 13000 Å in thickness so as to cover the entire part of the image sensor, pre-baked at about 160° C., patterned by the photolithographic and etching processes, and baked again. Accordingly, the contact portion for energizing the metal electrode 22 and the portion for taking electric charge from the transparent electrode 24 in the light-receiving element 11a; the contact portion connecting the lines for transferring the electric charge generated at each light-receiving element 11a and the contact portion outputting the electric charge to the wiring group 13 in the TFT; and the contact holes 34 connecting the upper and lower lines in the wiring group 13 are formed. Thereafter, the polyimide layer is subjected to a descumming process using an $O_2$ plasma to be completely removed from the contact holes 34 and the like.

Then, an Al layer is deposited about 10000 Å in thickness so as to cover the entire part of the image sensor by the DC magnetron sputtering method, subjected to a photolithographic and etching process for patterning using a solution in which hydrofluoric acid, nitric acid, phosphoric acid, and water are mixed, to remove photoresist. Accordingly, the line portion for energizing the metal electrode 22 and the line 30a portion for taking the electric charge from the transparent electrode 24 and transferring it to the drain electrode 41 of the TFT, the line 30b portion for leading out the electric charge from the source electrode 42 of the TFT to the line group 13 in the light-receiving element 11a and the upper line 32 in the line group 13 are formed.

Lastly, a polyimide layer is applied about 3 μm in thickness, pre-baked at 125° C., and then patterned by the photolithographic and etching process, and baked at 230° C. for 90 minutes to form a passivation layer (not shown). Thereafter, the polyimide layer is subjected to a descumming process to remove the residual polyimide.

The drive IC 15 and the like are mounted on the image sensor thus manufactured, which is then wire-bonded, and assembled.

A method of driving the image sensor of the present invention will be described.

When light is radiated from a light source (not shown) onto a document (not shown) placed on the light-receiving element array 11, the light reflected therefrom radiates onto each light-receiving element (photodiode PD), so that the electric charge commensurate with the darkness of the document and storing the generated electric charge in a parasitic capacitor or the like of the light-receiving element 11a. When the thin film transistor T is turned on by a gate pulse ΦG from the gate pulse generating circuit (not shown), the electric charge stored at the parasitic capacitor or the like is transferred to the interline capacitor Cj of the wiring group 13 with the photodiode PD connected to the common signal line 14 side. A case in which the electric charge is generated at the photodiodes PD1,1 to PD1,n in the first block will, be described in detail. Upon application of a gate pulse ΦG1 from the gate pulse generating circuit, the thin film transistors T1,1 to T1,n are turned on, causing the electric charge generated at the photodiodes PD1,1 to PD1,n to be transferred to and stored at the interline capacitors C1 to Cn in the matrix-formed wiring group 13, respectively. Thereafter, the thin film transistors T1,1 to T1,n are turned off.

A timing generating circuit (not shown) applies the read switching signals Φs1 to Φsn to the read switches SW1 to SWn of the drive IC 15, respectively, and sequentially applies each of reset switching signals ΦR1 to ΦRn to each of reset switching elements RS1 to RSn of the drive IC 15 with a one-timing delay. Accordingly, the electric charge stored at the interline capacitors C1 to Cn is outputted (from T out) as image signals, and the electric charge generated at the light-receiving elements (photodiodes PD) of a next block similarly transferred.

According to the method of manufacturing an image sensor of the embodiment, in which each light-receiving element 11a, each thin film transistor switching element in the electric charge transfer section 12, and the wiring group including the intermediate ground wiring layer 36 are formed simultaneously on the single substrate 21 efficiently, the Cr layer of the metal electrode 22 in the light-receiving element 11a, the Cr layer of the source and drain electrodes 41, 42 of the thin film transistor switching element, and the Cr layer of the ground layer 36 in the wiring group 13 can be deposited simultaneously and patterned, thereby allowing the preparation process to be simplified compared to the case in which the light-receiving element 11a, the thin film transistor switching element, and the wiring group 13 are prepared under separate processes. Thus the method according to the present invention provides the advantage of efficient and easy preparation process.

In addition, if the Cr layer of the metal electrode 22 of the light-receiving element 11a, the source and drain electrodes 41, 42 of the thin film transistor switching element, and the intermediate ground wiring layer 36 of the line group 13 may be replaced by Ta(tantalum), which is resistant to electrolytic corrosion compared to Cr, an image sensor with a still higher reliability can be obtained.

As a result of the method of manufacturing an image sensor according to the present invention, the metal electrode portion in the light-receiving element, the source and drain electrode portions of the thin film transistor switching element, and the ground layer portion in the line group are deposited simultaneously with a material such as Cr and then patterned, thereby allowing the image sensor to be prepared with ease under an efficient process.

What is claimed is:

1. A method of manufacturing an image sensor comprising a light-receiving element having a lower metal electrode portion, a photoconductive layer, and a transparent electrode which are sequentially laminated; a thin film transistor switching element having a gate electrode, a source electrode portion, and a drain electrode portion; and a group of upper and lower wiring layers interposing an upper insulating layer, a ground layer, and a lower insulating layer therebetween, said upper and lower wiring layers being arranged in a matrix form; said light-receiving element, said thin film transistor switching element, and said wiring layer group being formed on an identical substrate, said method comprising the steps of:

simultaneously depositing the lower metal electrode portion of said light-receiving element, the source electrode portion and the drain electrode portion of said thin film transistor switching element, and the ground layer of said wiring layer group using an identical metal; and thereafter patterning said deposited portions.

2. A method of manufacturing an image sensor as claimed in claim 1, wherein said ground layer is formed to have a meshed pattern, and intersection portions of said ground layer overlap on intersecting portions of said upper and lower wiring layers.

3. A method of manufacturing an image sensor as claimed in claim 1, wherein said ground layer is formed to be one of zigzagged and punched with punch holes, and intersecting portions of said upper and lower wiring layers are shielded by said ground layer.

4. A method of manufacturing an image sensor comprising a light-receiving element having a transparent electrode and a lower metal electrode formed below the transparent electrode; a thin film transistor switching element having a gate electrode, a source electrode, and a drain electrode; and a group of wiring layers including an upper wiring layer, a lower wiring layer, and an intermediate wiring layer formed between an upper insulating layer and a lower insulating layer disposed between the upper wiring layer and the lower wiring layer; the method comprising the steps of:

depositing a layer of conductive material on a layer of material formed above a substrate;

thereafter patterning the layer of conductive material to form the lower metal electrode of the light-receiving element, the source and drain electrodes of the thin film transistor switching element, and the intermediate wiring layer of the wiring layer group.

5. A method of manufacturing an image sensor comprising a light-receiving element having a transparent electrode and a lower metal electrode formed below the transparent electrode; a thin film transistor switching element having a gate electrode, a source electrode, and a drain electrode; and a group of wiring layers including an upper wiring layer, a lower wiring layer, and an intermediate wiring layer formed between an upper insulating layer and a lower insulating layer disposed between the upper wiring layer and the lower wiring layer; the method comprising the steps of:

depositing a first layer of conductive material on a substrate;

thereafter patterning the first layer to form the gate electrode of the thin film transistor switching element and the lower wiring layer of the wiring layer group;

depositing a second layer of conductive material on a layer of material formed above the substrate;

thereafter patterning the second layer to form the lower metal electrode of the light-receiving element, the source and drain electrodes of the thin film transistor switching element, and the intermediate wiring layer of the wiring layer group.

* * * * *

UNITED STATES PATENT AND TRADEMARK OFFICE
CERTIFICATE OF CORRECTION

PATENT NO. : 5,360,744
DATED : November 01, 1994
INVENTOR(S) : Yasumoto Shimizu et al It is certified that error appears in the above-indentified patent and that said Letters Patent is hereby corrected as shown below:

Claim 2, Column 10, Line 1, "intersection" should read --intersecting--.

Signed and Sealed this

Sixteenth Day of May, 1995

BRUCE LEHMAN

*Attest:*

*Attesting Officer*   Commissioner of Patents and Trademarks